US008115683B1

(12) United States Patent
Stefanakos et al.

(10) Patent No.: US 8,115,683 B1
(45) Date of Patent: Feb. 14, 2012

(54) RECTENNA SOLAR ENERGY HARVESTER

(75) Inventors: Elias K Stefanakos, Tampa, FL (US); D Yogi Goswami, Tampa, FL (US); Shekhar Bhansali, Tampa, FL (US)

(73) Assignee: University of South Florida, Tampa, FL (US)

( * ) Notice: Subject to any disclaimer, the term of this patent is extended or adjusted under 35 U.S.C. 154(b) by 388 days.

(21) Appl. No.: 12/436,601

(22) Filed: May 6, 2009

Related U.S. Application Data

(60) Provisional application No. 61/050,854, filed on May 6, 2008.

(51) Int. Cl.
*H01Q 1/24* (2006.01)
(52) U.S. Cl. .................. 343/700 MS; 136/255; 136/256
(58) Field of Classification Search ........... 343/700 MS; 136/255, 256
See application file for complete search history.

(56) References Cited

U.S. PATENT DOCUMENTS

| | | | |
|---|---|---|---|
| 7,091,918 B1* | 8/2006 | Bhansali et al. | 343/767 |
| 7,268,517 B2 | 9/2007 | Rahmel et al. | |
| 7,362,273 B2 | 4/2008 | Sarehraz et al. | |
| 7,486,236 B2* | 2/2009 | Sarehraz et al. | 343/700 MS |
| 7,619,570 B1* | 11/2009 | Sarehraz et al. | 343/700 MS |
| 7,799,988 B2* | 9/2010 | Cutler | 136/255 |
| 2007/0047056 A1 | 3/2007 | Kempa et al. | |
| 2007/0069965 A1 | 3/2007 | Sarehraz et al. | |
| 2007/0096990 A1 | 5/2007 | Sarehraz et al. | |
| 2007/0137697 A1 | 6/2007 | Kempa et al. | |
| 2007/0240757 A1 | 10/2007 | Ren et al. | |
| 2010/0193017 A1* | 8/2010 | Huth | 136/255 |

FOREIGN PATENT DOCUMENTS
WO  2005104331 A1  3/2005

OTHER PUBLICATIONS

B. Berland, Photovoltaic Technologies Beyond the Horizon: Optical Rectenna Solar Cell,—Final Report, National Renewable Energy Laboratory/SR-520-33263, Feb. 2003 (www.nrel.gov).
D.Y. Goswami, S. Vijayaraghavan, S. Lu, G. Tamm, New and emerging developments in solar energy, Solar Energy vol. 76, Issues 1-3, Solar World Congress 2001, Jan.-Mar. 2004, pp. 33-43.
M.Sarehraz, K.A. Buckle, T. Weller, E. Stefanakos, S. Bhansali, Y.D. Goswami, and S. Krishnan, Rectenna developments for solar energy collection, Conference record of 31st Photovoltaic Specialists Conference, Jan. 3-7, 2005, IEEE.
S. Krishnan, Design, Fabrication and Characterization of Thin-Film MIM Diodes for Rectenna Array, MS Thesis, University of South Florida, May 26, 2004.
D.K. Kotter, S.D. Novack, W.D. Slafer, P. Pinhero, Solar Nantenna Electromagnetic Collectors, Proceedings of Energy Sustainability/ ES2008-54016, Aug. 10-14, pp. 1-7.
S. Krishnan, et al., Effects of dielectric thickness and contact area on current—voltage characteristics of thin film metal-insulator-metal diodes, Thin Solid Films 516 (2008), pp. 2244-2250.

(Continued)

*Primary Examiner* — Tho G Phan
(74) *Attorney, Agent, or Firm* — Robert Varkonyi; Smith & Hopen, P.A.

(57) ABSTRACT

A rectenna is a combination of an antenna and a rectifier (diode). Because of limitations in nanotechnology fabrication, it has not been possible to develop rectennas that can operate in the visible frequency range. Current work has gone to producing rectennas that operate in the far infrared (thermal emission) frequency range. To harvest solar energy with rectennas to produce electric power and since rectennas cannot operate at such high frequencies, the present invention provides rectenna configurations to overcome this problem.

21 Claims, 9 Drawing Sheets

OTHER PUBLICATIONS

S. Krishnan, et al., Design and development of batch fabricatable metal-insulator-metal diode and microstrip slot antenna as rectenna elements, Sensors and Actuators: A Physical (2007), doi:10.10161/j.sna.2007.04.021.

M.Sarehraz, Novel Rectenna for Collection of Infrared and Visible Radiation, Power Point Presentation USF, Mar. 23, 2005.

M. Sarehraz, Novel Recetnna for Collection of Infrared and Visible Radiation, PhD Dissertation USF, Mar. 23, 2005.

* cited by examiner

US 8,115,683 B1

RECTENNA SOLAR ENERGY HARVESTER

CROSS REFERENCE TO RELATED APPLICATION

This application claims priority to pending U.S. Provisional Patent Application No. 61/050,854, entitled "Rectenna Solar Energy Harvester", filed on May 6, 2008, the contents of which are herein incorporated by reference.

FIELD OF INVENTION

This invention relates to enhancing thermoelectric properties of devices. Specifically, the invention entails using nanoscale fabrication on thermoelectric materials to improve the efficiency of thermoelectric devices.

BACKGROUND OF THE INVENTION

Approximately 80% of the world's power is generated by fossil fuel combustion. In the United States, more than 90% of greenhouse gas emissions come from the combustion of fossil fuels. Combustion of fossil fuels also produces other air pollutants, such as nitrogen oxides, sulfur dioxide, volatile organic compounds and heavy metals. Additionally, the cost of producing energy is skyrocketing, due in part to depleting fossil fuel reserves. Clean, renewable energy sources are required to meet upcoming energy demands.

Light energy is characterized by a dual nature both from a quantum point of view as photons and from a wave point of view as randomly polarized electromagnetic radiation with a wavelength between 400 nm and 700 nm. If the ultraviolet and infrared portion of the spectrum is included, the range of wavelengths is extended at both extremes. Presently, all practical solar cell energy collection schemes utilize the photon nature of light. For example, the conversion of solar energy to electrical energy using the photovoltaic effect depends upon the interaction of photons with energy equal to or greater than the band-gap of the rectifying material. With continued research, the maximum amount of energy captured using the photovoltaic mechanism is estimated to be around 30%.

A rectenna is a combination of an antenna and a rectifier (diode). Rectennas have been studied mainly for microwave-based power transmission, with efficiencies exceeding 80% at 2.5 GHz [W. C. Brown, "The history of power transmission by radio waves" IEEE Trans. Microwave Theory and Techn., 32:9, 1230-1242, September 1984), with the devices used to directly convert microwave energy into DC electricity. Its elements are usually arranged in a multi element phased array with a mesh pattern reflector element. Rectennas are highly efficient at converting microwave energy to electricity, with observed efficiencies above 90%. Optical rectennas harvest solar energy and convert it into electric power. Optical rectennas consist of an optical antenna to efficiently absorb the incident solar radiation and a high-frequency metal-insulator-metal (MIM) tunneling diode that rectifies the AC field across the antenna, providing DC power to an external load. The combination of a rectifying diode at the feedpoints of a receiving antenna is often referred to as a rectenna. Utilizing a rectenna to harvest solar energy relies upon the electromagnetic nature of radiation and is not limited by the band-gap of the rectifying material. As such, this method is not fundamentally band-gap limited. At microwave frequencies (~2.4 GHz) the rectenna approach has been demonstrated to be approximately 90% efficient. Rather than generating electron-hole pairs as in the photovoltaic method, the electric field from an incident electromagnetic radiation source will induce a wave of accelerated electric charge in a conductor. Efficient collection of the incident radiation is then dependent upon resonance length scales and impedance matching of the collecting antenna to the rectifying diode to minimize losses. However, methods of harvesting high-frequency radiation utilizing rectennas have identified several key problems with the approach. These problems include impedance matching, rectification, polarization, limited bandwidth and captured power.

Traditionally, the $\lambda/2$ dipole antenna is the most commonly used antenna by the designer as the receiving device for a rectenna due to the straightforward design procedure and the ease of fabrication as a printed circuit antenna. However, the $\lambda/2$ dipole has shortcomings, such as only supporting a single polarization. It exhibits a relatively low gain, it exhibits very high conductor losses at higher frequencies and its radiation pattern is omni-directional. It has been shown that the rectifier efficiency would be less than 0.1% for the calculated power at the terminal of a rectenna utilizing a $\lambda/2$ dipole antenna.

Polarization of solar radiation is known to be random (unpolarized). An unpolarized electromagnetic wave is a collection of waves that have an equal distribution of electric field orientations in all directions. A randomly polarized wave can be decomposed into two main components, $E_x$ and $E_y$. The typical $\lambda/2$ dipole antenna only supports a single polarization and is therefore not useful for the collection of solar radiation or other unpolarized electromagnetic energy.

Accordingly, what is needed in the art is an improved rectenna for the collection of electromagnetic energy and more particularly an improved rectenna for the collection of solar energy that overcomes the identified deficiencies in the prior art solutions.

The antenna coupled Metal-Insulator-Metal (MIM) detector is a device that can operate at ambient temperature and can be used as detector and harmonic mixer up to 150 THz (D. A. Jennings, et al., Appl. Phys. Lett. 26 (1975) 510). In a MIM tunnel diode, the electrons flow between the metal electrodes via an ultra-thin insulator layer (S. M. Sze, Physics of Semiconductor Devices, $2^{nd}$ Ed., Wiley Inter-Science Publication, New York, 1981, pp. 553-558).

Current work has focused on using similar devices, scaled down in size using nanotechnology, to convert light into electricity at much greater efficiencies than what is currently possible with traditional solar cells. Because of limitations in nanotechnology fabrication, it has not been possible to develop rectennas that can operate in the visible frequency range. Theoretically, high efficiencies can be maintained as the device shrinks, but current optical rectennas have only obtained roughly 1% efficiency using light. Current work with infrared rectennas has created more efficient energy collection devices.

SUMMARY OF THE INVENTION

This invention uses rectennas in solar energy harvesting for the production of electric power. To utilize the entire solar spectrum, the first rectenna converts solar energy to thermal energy by a variety of methods. Such methods include, heating of a black surface, using a number of solar collectors used for trapping the sun's energy, ie. photovoltaic, solar hot water heating, solar concentrator receiver, waste thermal energy, etc. The large area rectenna is placed underneath the collecting surface or in front of the emitting surface for the direct conversion of thermal (infrared) energy to electricity.

The solar array's feed system must exhibit very low losses at optical frequencies. A dielectric rod antenna is useful as a high gain antenna element for the solar array antenna.

In Nahas' model, shown in FIG. 1, the antenna is responsible for intercepting the electromagnetic waves within a specific frequency band. The low pass filter (LPF), which prevents the re-radiation of higher harmonics generated by the diode, also operates as a matching circuit between the antenna and the rectifier. Rectification is accomplished in the diode's non-linear junction resistance, and the DC-filter passes the DC signal to the load. The skin effect in the feed system of the array, a non-radiative dielectric (NRD) waveguide is used as the feed structure for the solar array antenna. The solar antenna was modified to support the interception of duel polarized electromagnetic waves because of the random nature of solar radiation's polarization. The antenna's bandwidth may also be improved by adding tuning stubs to the antenna's feed. The three available interconnection methods for rectennas in an array, i.e. series, parallel, and hybrid, were also considered in the manufacture of the energy conversion device. The DC losses associated with solar rectennas interconnected in a hybrid array was calculated. To reduce the extremely high DC losses in the grid to an acceptable level, a novel technique was used to increase the width and height of the DC lines.

A Schottky diode, seen in FIG. 2, is typically used for rectification and detection at low frequencies up to 5 THz. Modeling the diode as resistors and capacitors, the junction resistance, Rjm is a nonlinear resistance of the barrier at the rectifying contact and is a function of the current. The metal-insulator-metal (MIM) diode is used as a rectifying device instead of the Schottky diode for frequencies in the far infrared to visible range. The MIM diode is useful due to its fast switching properties. A MIM diode consists of two metallic plates which are separated by a very thin insulating layer. The MIM diode is a quantum device, and rectification takes place by tunneling electrons through a very thin insulator barrier (d≦50 Å). Sanchez, et al. (A. Sanchez, et al., J. Appl. Phys. 49, 5270, 1978) model for a MIM consists of the barrier resistance and capacitance and ignores the contact resistance under the assumption that RT>>Rs. This assumption is valid only in the square law region of the characteristic curve of a MIM. A more complete model was presented by Odashima, et al. (H. Odashima, et al., "Characteristics of metal-insulator-metal diodes as generators for far infrared radioation", IEEE J. Quantum Elect. 32:2, February 1996), as shown in FIG. 3. The advantage of this model over Sanches' model is that it is not only valid in the square law region, but also in the linear region.

Disclosed is an energy collecting device, comprising at least one rectenna and an energy absorbing material. In some embodiments, the energy collecting device is a group of rectenna connected together in parallel, series, or in a hybrid connection. The rectenna optionally also include a transmission line in electrical communication with the antenna and the rectifier. The energy collecting device may also include an energy reflector located below the energy absorbing material and oriented to reflect electromagnetic radiation to the energy absorbing material. The rectenna uses at least one antenna connected to a metal-insulator-metal rectifier to allow conversion of the thermal energy to electricity. The antenna or antennas of the device are manufactured from one or more materials. Exemplary materials include aluminum, gold, carbon, a dielectric material, doped Si, GaAs, SiGe, GaN, and Ag. In some embodiments, the antenna are a dipole antenna design, a conventional microwave antenna, a bow-tie antenna design, a loop antenna, and/or a spiral antenna design. Additionally, the antenna may include at least one tuning stub on the antenna's feed. The antenna or antennas also form a plurality of stacked antennas in specific embodiments. The plurality of stacked antennas may be disposed such that at least one antenna array aligns with each orthogonal 3-dimensional axis, allowing maximal collection of unpolarized energy.

The metal-insulator-metal rectifier may be manufactured from one or more materials, such as Ni, Au, Ag, Pt, NiO, Al, $Al_2O_3$, Nb, $NbO_x$, Cr, Ag, and CrO. In specific embodiments, the metal-insulator-metal rectifier is comprised of Ni and NiO, and wherein the metal-insulator-metal rectifier has counter electrodes made of at least one compound selected from the group consisting of Ni, Au, Ag, Pt, and Ni—NiO—Cr/Au, and may be manufactured to include a Ni electrode, a NiO layer, a Cr layer and an Au electrode.

The energy absorbing material, is placed in proximity to the rectenna, such that absorbed electromagnetic energy is material absorbs electromagnetic energy and radiates the electromagnetic energy as thermal energy. Exemplary energy absorbing materials include a black surface, a solar collector, a photovoltaic, a solar hot water heater, a solar concentrator receiver, and a waste thermal energy device. All objects with a temperature above absolute zero possess the radiation capability of electromagnetic waves. Not only do they radiate electromagnetic waves, but they also absorb and reflect any EM energy incident upon them. Kirchoff established in 1859, that a good radiator of EM energy is a good absorber as well. A perfect absorber is usually called a blackbody, and by definition, such a body is also a perfect radiator, which was modeled by Plank's law of radiation.

Also disclosed is a method for collecting unused electromagnetic energy. Using the device described above, unused electromagnetic radiation is absorbed in the energy absorbing material, where it is converted into thermal energy. This thermal energy is then collected by the antenna or antennas and converted by the rectenna into electricity. In some embodiments, the unused electromagnetic energy is thermal energy, ultraviolet energy, visible energy, infrared energy, and may specifically be energy originating from the sun. The electricity generated using this method is, in specific embodiments, DC electricity. In some embodiments of the invention, electromagnetic energy not absorbed by the energy absorbing material is reflected by an electromagnetically reflective material, such as a mirror. This allows the energy absorbing material additional opportunity to absorb the electromagnetic energy, improving the efficiency of the design.

BRIEF DESCRIPTION OF THE DRAWINGS

For a fuller understanding of the invention, reference should be made to the following detailed description, taken in connection with the accompanying drawings, in which.

μm² contact area illustrating the top view and cross-sectional view of diode B. The cross-section is cut across the metal electrodes through the diode.

Figure 8:
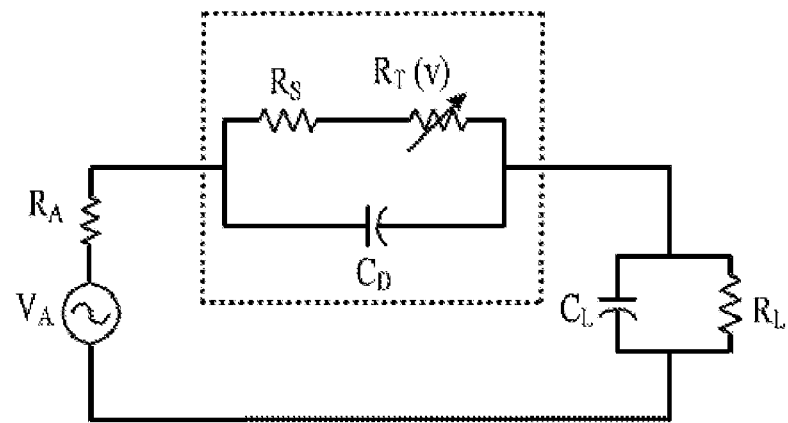

FIG. 8 is an illustration of an equivalent circuit of the MIM rectifier.

Figure 9:
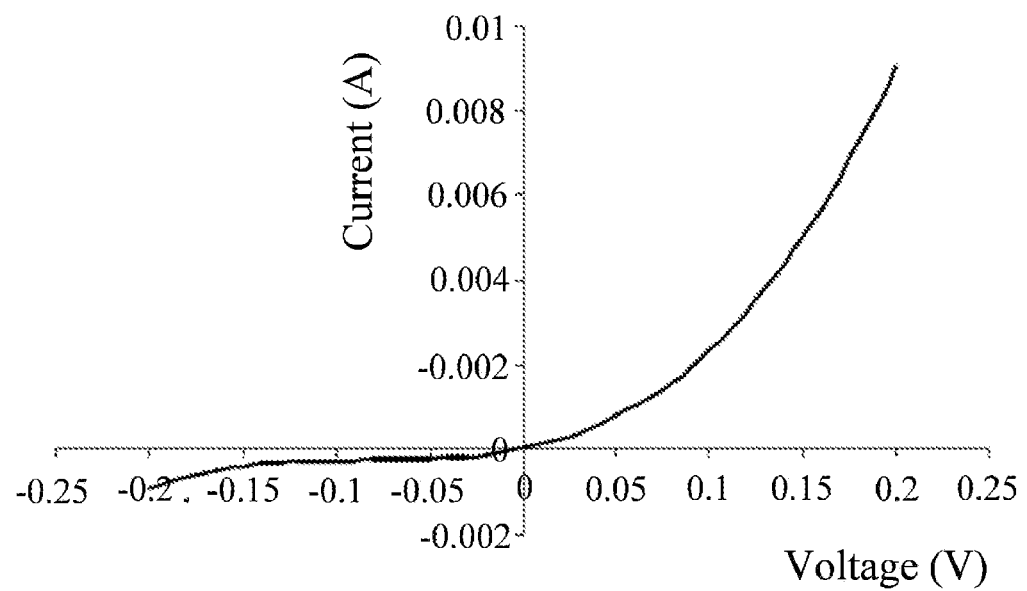

FIG. 9 is graph depicting the third order approximation of the measured I-V curve of a MIM diode.

Figure 10:
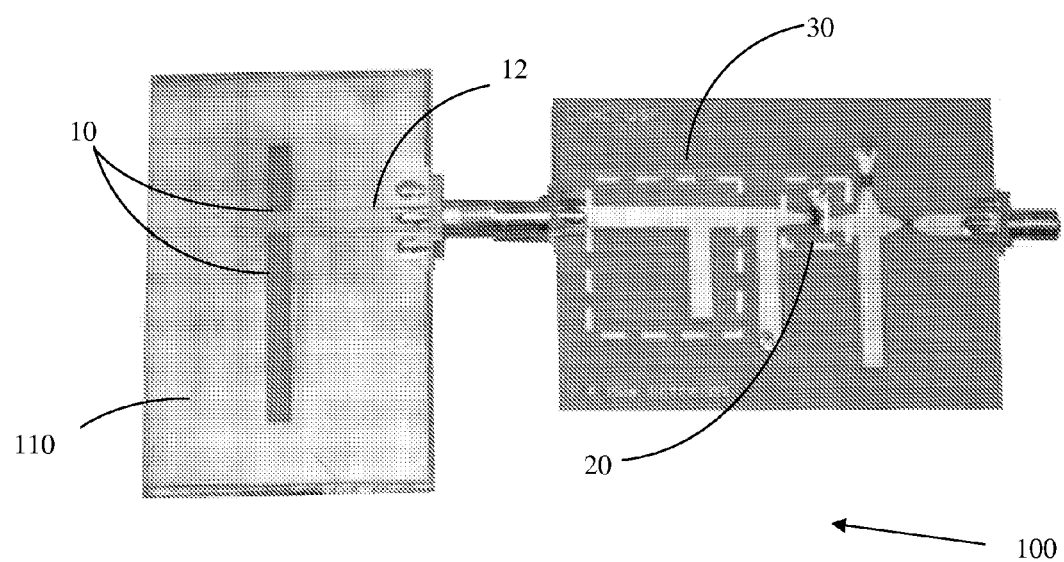

FIG. 10 is a image of the rectenna device of the present invention. This embodiment of the device uses a dipole antenna design.

Figure 11:
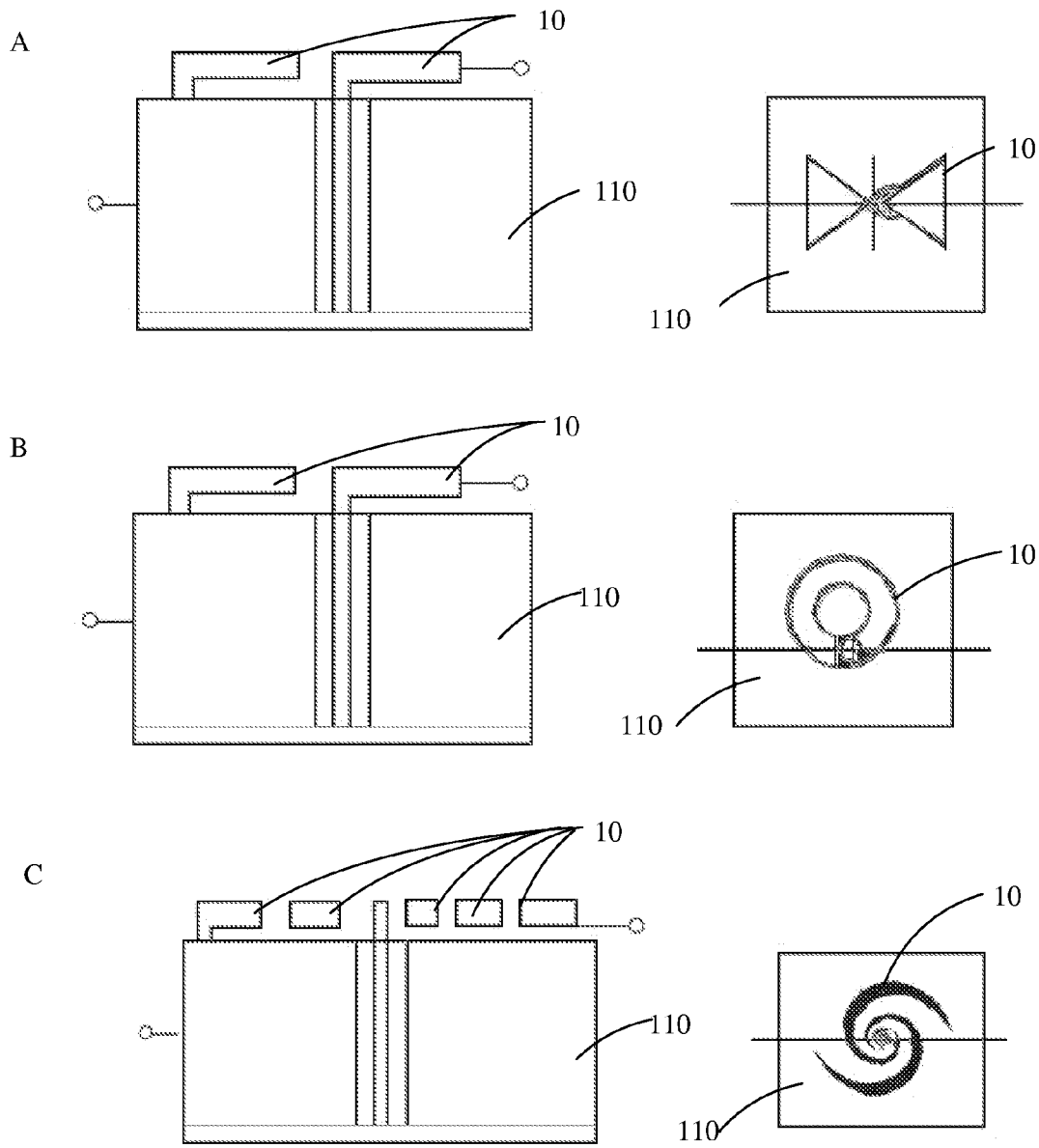

FIG. 11(a) through (c) are a schematic diagrams of the energy conversion device of the present invention using (a) bow-tie antenna; (b) a loop antenna; and (c) a spiral antenna. Images are shown as cross-sectional views and top-down views.

Figure 12:
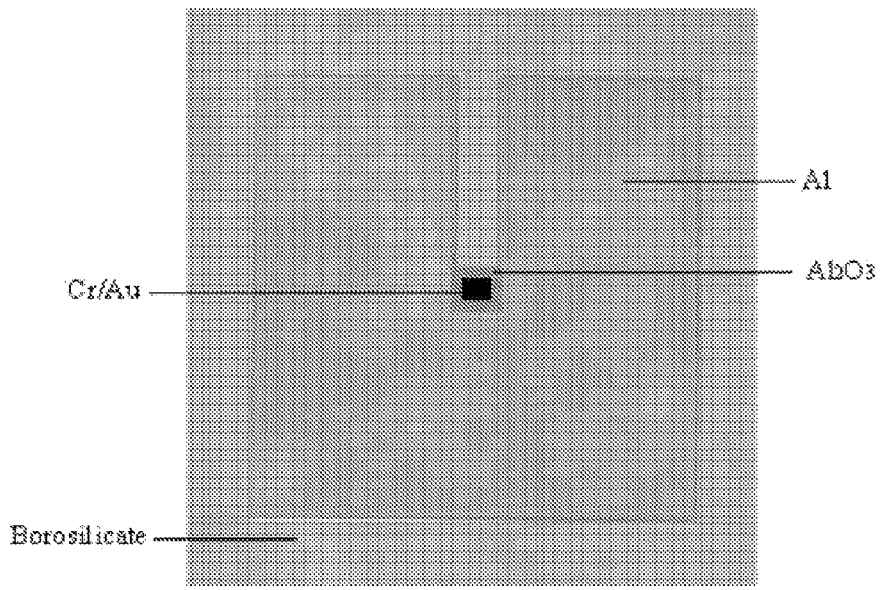

FIG. 12 is a micrograph image of a metal-insulator-metal diode using Ni—NiO. The diode has a 100 μm² contact areas.

Figure 13:
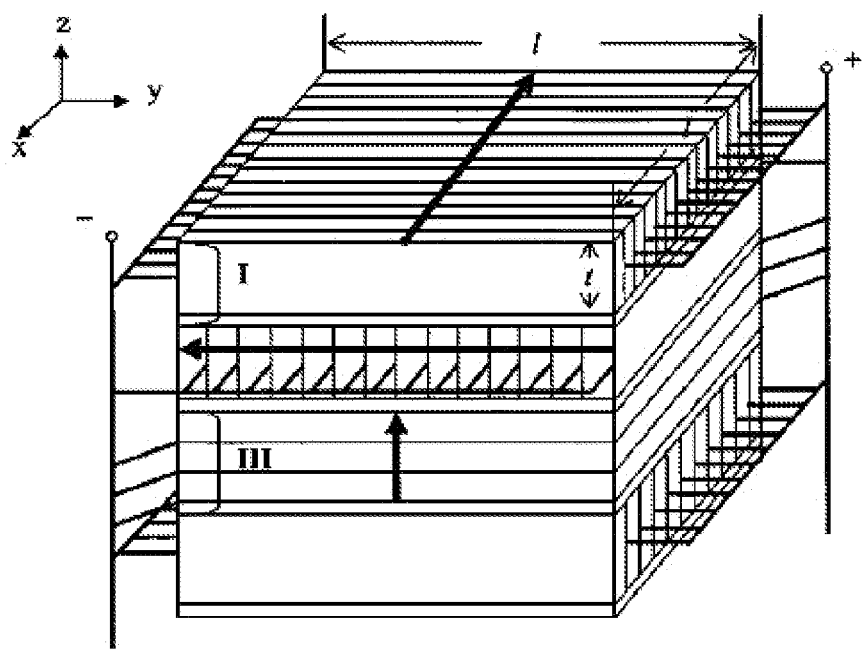

FIG. 13 is a schematic diagram used in solar collection in an orthogonal array.

DETAILED DESCRIPTION OF THE PREFERRED EMBODIMENT

The present invention utilizes the entire solar spectrum in the harvest of energy. A first collector converts the solar energy to thermal energy by a variety of methods. Such methods include, heating of a black surface, using a number of solar collectors used for trapping the sun's energy, ie. photovoltaic, solar hot water heating, solar concentrator receiver, waste thermal energy, etc. A large area rectenna is placed underneath the collecting surface or in front of the emitting surface for the direct conversion of thermal (infrared) energy to electricity.

As used herein, the term "array" refers to a plurality of antennas that are attached to a substrate material proximally to one another. The antennas may be printed, grown nanotubes or nanorods, or other antenna type known in the art. The arrays may consist of antenna aligned perpendicular to the other antenna to capture polarized or collimated energy, or antenna arranged adjacent to the other antenna allowing capture of unpolarized energy, such as energy propagated in multiple dimensions and solar energy.

As referred to herein, a "catalytic transition metal" can be any transition metal, transition metal alloy or mixture thereof. Examples of a catalytic transition metal include, but are not limited to, nickel (Ni), silver (Ag), gold (Au), platinum (Pt), palladium (Pd), iron (Fe), ruthenium (Ru), osmium (Os), cobalt (Co), rhodium (Rh) and iridium (Ir). In an embodiment, the catalytic transition metal comprises nickel (Ni).

The terms "nanotubes" and "nanostructures," which are employed interchangeably herein, refer to material structures having at least one dimension in a range of one nanometers (nm) to about one micrometer.

Figure 1:
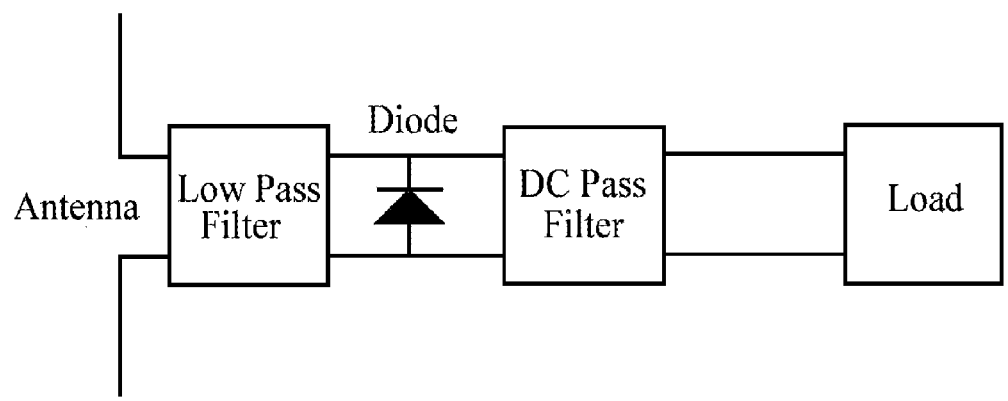
FIG. 1 is a block diagram of a rectenna.
Figure 2:
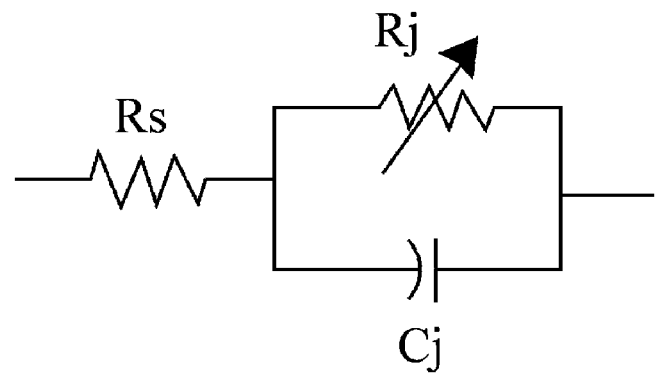
FIG. 2 is a diagram of a schottky diode equivalent model.
Figure 3:
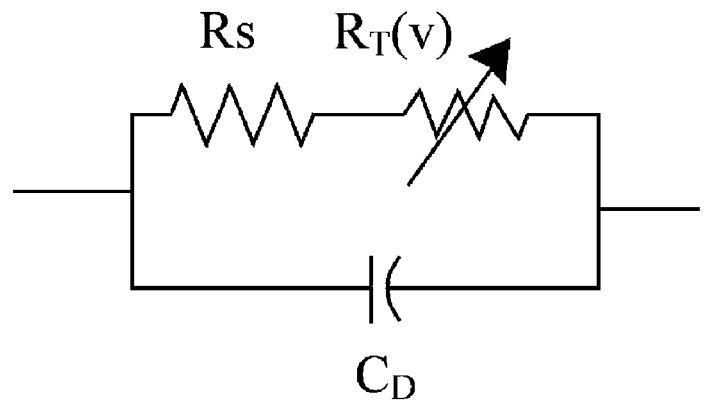
FIG. 3 is a diagram of a metal-insulator-metal diode equivalent circuit model.
Figure 4:
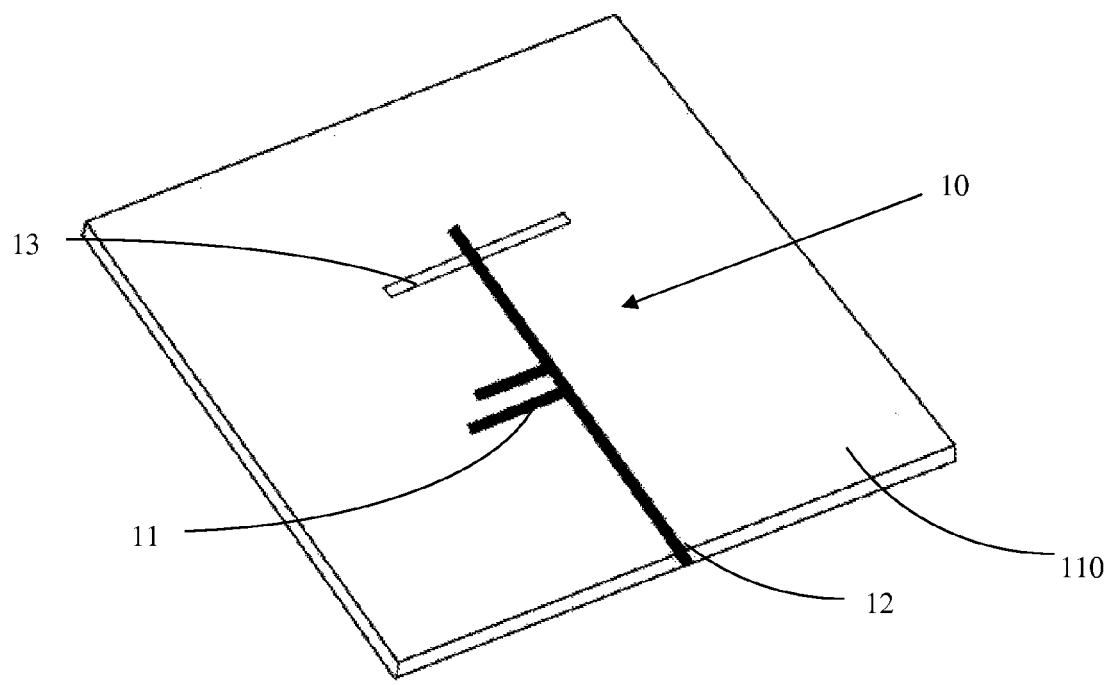
FIG. 4 is a diagram of an aperture-coupling technique utilizing tuning stubs.

Printed antennas have an inherently narrow bandwidth (approximately a few percent). This is due to their electrically thin ground-plane-backed dielectric substrate, which leads to a high quality factor (Q). The impedance bandwidth (BW) is usually specified in terms of a voltage standing wave ratio (VSWR) over a frequency range. The quality factor of the resonator and VSWR can be used to calculate bandwidth by The bandwidth of the printed antenna has been investigated (D. M. Pozar, "A review of bandwidth enhancement techniques for microstrip antenna", Microstrip Antennas by IEEE Antennas and Propagation Soc., 1999), and the most effective bandwidth improvement technique has been identifies as the aperature-coupling technique with a tuning stub (J. F. Zucher, "The SSFIP: a global concept for high performance broadband planar antenna", Microstrip Antennas by IEEE Antennas and Propagation Soc., 1999; F. Croq and D. M. Pozar, "Millimeter-wave design of wide-band aperature-coupled stacked microstrip antenna", Microstrip Antennas by IEEE Antennas and Propagation Soc.), which is a variation of proximity coupling, also known as electromagnetic coupling. In this technique, seen in FIG. 4, the ground plane is inserted between the feed line and the radiating element and coupling achieved by creating a slot in the ground plane. The position of the tuning stub relative to the patch can be used to match the input impedance for the maximum bandwidth. Another advantage to this technique is that the feed structure is completely shielded from the radiating element, which in turn improves the purity of the radiation pattern.

Figure 5:
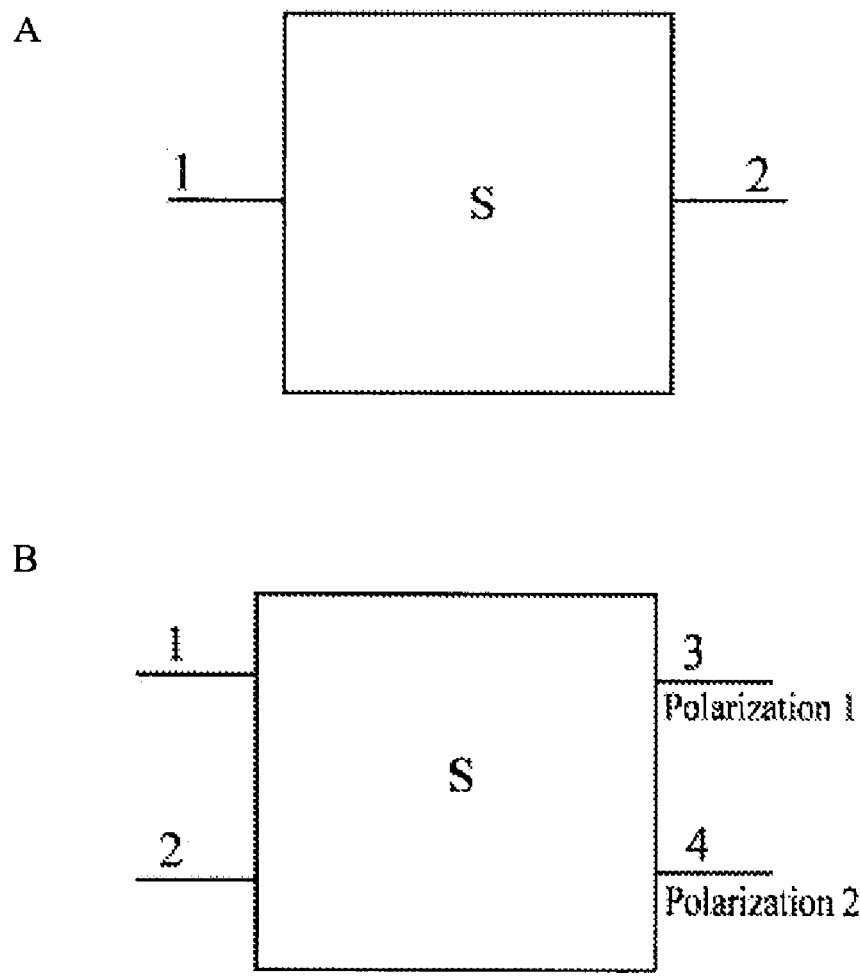
FIGS. 5(a) and (b) are S-parameter representations of antennas, (a) single polarization, and (b) dual polarization rectifier designs.

Another class of antennas, known as dual polarized antennas, is capable of generating two orthogonal linearly polarized waves simultaneously. This makes them well suited for capturing randomly polarized electromagnetic waves. The dual polarized antennas can be represented as a four port network, as seen in FIG. 5, and additional parameters account for the second polarization. S21 is the isolation between the two input ports, and corresponds to the amount of signal from polarization 1 coupled into port 2. S41 corresponds to the amount of signal not transmitted as polarization 1, but appears as polarization 2. The isolation in dual polarized antennas is usually specified by S21 or S12, (the coupling between the two ports), whereas S41 or S32 is specified by cross-polarization of the radiated wave (P. S. Hall, "Review of techniques for dual and circularly polarized microstrip antennas" Microstrip Antennas by IEEE Antennas and Propagation Soc., 1999). It should be noted that in order to achieve dual polarization, the feed points to an antenna must be doubled, which adds to the complexity of the feed system.

In order to calculate the power captured by a single element antenna, one needs to know the amount of power available from the sun on the earth. The solar constant is the total power density radiated by the sun (from 0.115 micron to 1000 micron wavelength). This is equal to 1353 W/m² (W. Palz, "Solar power" Butterwoths. UNESCO, London, 1978) outside the earth's atmosphere, and is known as air mass zero (AM0 is the extraterrestrial intensity). However, due to atmosphere attenuations, this power is considerably lower at sea level. Equation 3.11, known as Bouger's law (D. Y. Goswami, et al., "Principles of solar engineering", TYLOR & FRANCIS, Phila., 2000), can be used to calculate the amount of power available at sea level, also known as air mass one (AM1 is the terrestrial intensity when the sun is overhead).

$$I_b = I_0 e^{-km} - \quad \text{(II)}$$

Figure 6:
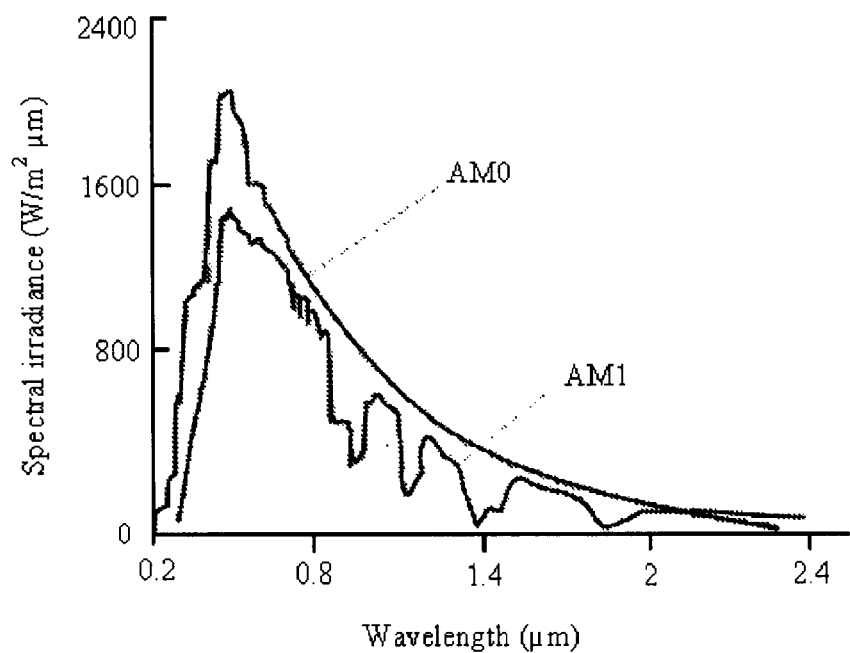
FIG. 6 is a graph showing the solar spectrum for AM0 and AM1.
Figure 7:
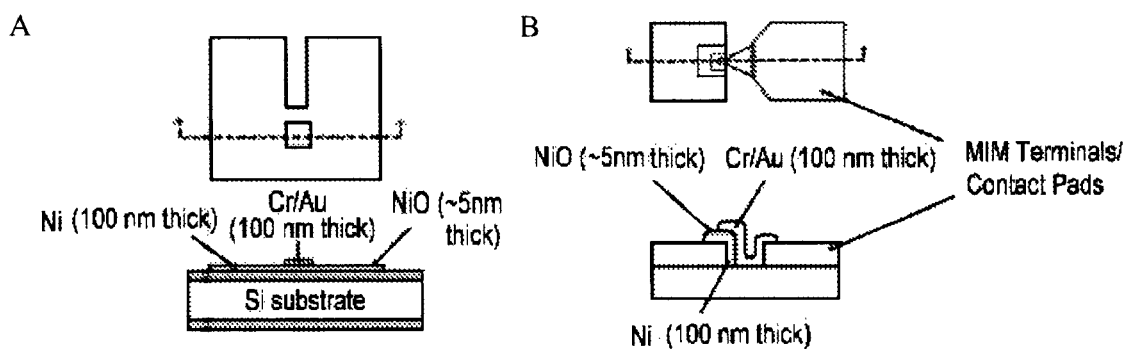
FIGS. 7(a) and (b) are illustrations of the metal-insulator-metal diode used in the present invention. Thin film Ni—NiO—Cr/Au diode with (a) 100 $\mu m^2$ contact area illustrating the top view and cross-sectional view of diode A, (b) 1

In Equation 3.11, $I_0$ and $I_b$, are the terrestrial and extraterrestrial intensities of radiation, respectively; k is the absorption constant for the atmosphere, and m is the dimensionless path length of sunlight through the atmosphere, which is called air mass ratio. FIG. 6 illustrates the sun's spectral irradiance as a function of wavelength for two air mass ratios. The power at the terminal of a λ/2 dipole in the presence of a reflecting ground plane (D. Pozar, "Scattered and absorbed powers in receiving antennas", IEEE Antennas and Propagation Mag., 46:1, February 2004) can be calculated by $$BW = \frac{(VSWR-1)}{Q\sqrt{VSWR}} \quad \text{(I)}$$

$$P_T = \frac{|V_T|^2}{2R_T} \quad \text{(III)}$$

Where $R_T$ is the radiation resistance of a $\lambda/2$ dipole (73Ω). Table 1 shows the results of a calculation of the voltage and the power at the antenna's terminal as a function of bandwidth.

TABLE 1

Calculated captured solar power at the terminal of $\lambda/2$ dipole.

| BW % | 2.1 | 4.3 | 6.5 | 8.6 | 10.8 | 13 | 15.2 | 17.4 | 19.5 | 21.7 |
|---|---|---|---|---|---|---|---|---|---|---|
| S(W/m²) | 15.10 | 30.62 | 44.71 | 59.10 | 72.90 | 86.15 | 99.43 | 112.89 | 126.12 | 139.86 |
| E (V/m) | 75.44 | 107.44 | 129.82 | 149.26 | 165.78 | 180.21 | 193.61 | 206.29 | 218.05 | 229.62 |
| $V_T$ (μV) | 11.22 | 15.98 | 19.31 | 22.21 | 24.66 | 26.81 | 28.80 | 30.69 | 32.44 | 34.16 |
| $P_T$ (pW) | 0.84 | 1.70 | 2.48 | 3.28 | 4.05 | 4.79 | 5.53 | 6.28 | 7.01 | 7.78 |

A typical linearly polarized $\lambda/2$ dipole antenna has a 3-db fractional bandwidth of 15%. According to table 1, this antenna is capable of capturing a power of 2.75 pW. Given the randomly polarized nature of solar radiation, an increase of power by a factor of 2 (to 5.5 pW) is expected when a dual polarized $\lambda/2$ dipole antenna is employed. The power captured by a single $\lambda/2$ dipole antenna will be sufficient for a MIM diode to operate in its optimum rectification efficiency region. This is significant, as it suggests the need to use an array prior to rectification in order to increase the captured power. According to Verdet's theory, the array must be configured inside the sun's coherence circle in order to operate.

Schottky diodes are routinely used in high frequency rectifiers because of their fast response time. However, these diodes have an operating frequency upper limit of approximately 3 THz (T. W. Crowe, et al., "GaAs schottky barrier diodes for THz applications", Microwave Symposium Digest., 1992, IEEE MTT-S Int'l, v2, 1141-1144, Jun. 1-5 1992), which is far below visible light frequencies. The diode of choice for the optical frequency rectifier is a metal-insulator-metal (MIM) diode, also known as a tunneling diode. These diodes are the fastest available diodes for detection in the optical region.

This concept has been exploited for reliable rectification in the high-frequency (NGHz) regime for the desired application. The MIM diode rectifies electromagnetic radiation induced by the antenna through two dominant phenomena, that is, (a) thermionic emission and (b) quantum mechanical tunneling (K. L. Chopra, Thin Film Phenomena, McGraw-Hill, Inc. New York, 1969, p. 487). The smaller the thickness of the insulator the higher the current delivered. More specifically, for dielectric thicknesses of less than 4 nm, the rectification is primarily through tunneling, a critical requirement for realizing IR detection systems. Alternatively, for a thickness N4 nm, either thermionic emission or tunneling may predominate depending upon the barrier height (difference in work function between the two metals) and the applied voltage (J. G. Simmons, J. Appl. Phys. 35 (1964) 2472).

MIM diodes with dissimilar electrodes exhibit sufficient non-linearity and asymmetry thereby allowing significant current flow without external bias. The asymmetry is more pronounced when the work function between the two metal electrodes is large enough. Various research groups have fabricated and investigated MIM diodes with dissimilar metals (R. A. Pucel, et al., :losses in microstrip", Microwave Theory and Techniques, IEEE Transactions, 39:1, 98-106, January 1991; S. Ramo, et al., "Fields and waves in communications electronics", New York, Wiley, 1965; C. J. Chu, "Physical limitation of omnidirectional antennas", J. Appl Phys., v19, 1163-1175, December 1948; D. M. Pozar, "A review of bandwidth enhancement techniques for microstrip antenna" Microstrip Antennas by IEEE Antennas and Propagation Soc., 1999; J. F. Zucher, "The SSFIP: a global concept for high performance broadband planar antenna", Microstrip Antennas by IEEE Antennas and Propagation Soc., 1999).

Heiblum et al. (M. Heiblum, et al., IEEE J. Quantum Electron. 14, 159, 1978) reported that materials such as Al—Al$_2$O$_3$—Al (G. M. Elchinger, A. Sanchez, C. F. Davis Jr, A. Javan, J. Appl. Phys. 47 (1976) 591) Cr—CrO—Au (B. Berland, NREL Subcontractor Final Report, ITN Energy Systems, Inc., Littleton, Colo., 2003; E. Wiessendanger, F. K. Kneubuhl, Appl. Phys. 13 (1977) 343) Al—Al$_2$O$_3$—Ag (D. Diesing, et al., Thin Solid Films 342 (1999) 282) Nb—NbOx—Au (B. Berland, NREL Subcontractor Final Report, ITN Energy Systems, Inc., Littleton, Colo., 2003) are inefficient as rectifiers since they produce larger thermal contributions when exposed to a laser for the IR response.

Recently, MIM diodes fabricated with Ni and NiO showed improved electrical behavior with counter electrodes of Ni, Au, Ag, Pt (P. Esfandiari, et al., A. Weeks, Proc. SPIE 5783, 470, 2005; C. C. Bradley, G. J. Edwards, IEEE J. Quantum Electron. 9 (1973) 548; I. Wilke, et al., Appl. Phys. A 58, 329, 1994; M. R. Abdel-Rahman, F. J. Gonzalez, G. D. Boreman, IEE Electron. Lett. 40, 116, 2004). Recently, MIM diodes fabricated with Ni and NiO demonstrated better electrical behavior with a wide variety of counter electrodes like, Ni, Au, Ag, Pt etc. (P. Esfandiari, et al., Proc. SPIE 5783 (2005) 470; C. C. Bradley, G. J. Edwards, IEEE J. Quantum Electron. 9 (1973) 548; I. Wilke, et al., Appl. Phys. A 58 (1994) 329; M. R. Abdel-Rahman, et al., IEEE Electron. Lett. 40 (2004) 166). Previous MIM diodes fabricated using Ni/NiO do not possess high enough work-function difference to create a large asymmetry in the electrical behavior, seen in Table 2.

TABLE 2

A comparative study on experimentally determined sensitivity of thin film diode fabricated No and NiO.

| Authors | Type of MIM diode | Sensitivity (V$^{-1}$) |
|---|---|---|
| Hoofring, et al. | Thin-film Ni—NiO—Au 0.64 μm² | 4.55 |
| Abdel-Rahman, et al. | Thin-film Ni—NiO—Ni 0.075 μm² and 0.0014 μm² | 2.75 and 1.65 |
| Pashang Esfandiari, et al. | Thin-film Ni—NiO—Pt 0.0025 μm² | −13 |
| Current study | Thin-film Ni—NiO—Cr 1.45 μm² | 5 |

Asymmetric thin film MIM diodes with contact areas of 100 μm² (diode A) and 1 μm² (diode B) using Ni—NiO—Cr/Au. Ni has a work function ($\Psi_1$) of 5.15 eV (D. R. Lide, CRC Handbook of Chemistry and Physics, 74th Ed., CRC, 1993, pp. 12-105) and Cr has a work function ($\Psi_2$) of 4.5 eV, creating a work-function difference ($\Delta\Psi$) of 0.65 eV. This difference in work function has exhibited a higher degree of non-linearity and asymmetry and has been verified by studying the Current-Voltage (I-V) characteristics of the diode. Further, the experimental results were validated by theoretical calculations based on the current density equation provided by Simmons (J. G. Simmons, J. Appl. Phys. 34, 2581, 1963).

FIGS. 7(a) through 7(d) show schematic representations of diode A ((a) and (c)) and B ((b) and (d)). The design of diode A was a simple planar structure, wherein the layers were stacked upon each other on a silicon substrate. In the case of diode B a stepped structure with extended contact pads was designed thereby allowing the devices to be probed without damaging the active area. The diode structure consisted of a thick layer of Ni (100 nm), a thin layer of NiO (~1-3 nm), and a layer of Cr (30 nm) topped with a thick layer of Au (100 nm).

The MIM diodes have been fabricated on a 2" bulk silicon substrate with $SiO_2$ as the insulating layer. The silicon wafers were first cleaned thoroughly by a standard wafer cleansing process (W. Kern, D. Puotinen, RCA Rev. 31, 187, 1970), followed by thermal oxidation at 1100° C. in a dry-wet-dry oxygen atmosphere to grow an oxide layer approximately 450 nm thick. The thickness of the oxide layer was measured by a Null point Ellipsometer (Rudolph AutoEL III). These oxidized silicon wafers were used as the substrates. For the fabrication of the 100 µm² diodes, two lithographic mask levels (Futurrex NR-3000PY negative photoresist and Quintel Q-2000C Mask Aligner) were utilized to realize the structure. The first mask was used to define the Ni and NiO layers and the second mask was used to define the top metal layer (Cr or Au). A layer of Au was deposited on the substrate by thermal evaporation using Denton DV-502, and excess metal removed by lift-off in acetone. Direct current (DC) magnetron sputtering was utilized to deposit the bottom electrode (Ni) and the insulator layer (NiO). 100 nm of Ni was deposited by maintaining the gas pressure and DC power at 2 Pa and 100 Watts, respectively. The thickness of the deposited film was determined using a quartz crystal monitor. Then, a thin layer (~3 nm) of NiO was deposited in-situ by a plasma oxidation process. Later, Ni and NiO coated samples were subjected to the final photolithography step to pattern the Cr layer. A 30 nm of Cr was deposited by thermal evaporation followed by Au deposition (100 nm) to obtain the 100 µm² MIM structure. Finally, the top electrode Cr region was defined using e-beam lithography and topped off with Au. A 150 nm thick PMMA (MicroChem 950-K 3% Anisole) was spun on the substrate and baked at 180° C. for 2 hours. The devices were then patterned by a modified JEOL JSM-840 Scanning Electron Microscope (SEM). Nabity's Nanometer Pattern Generation System was used to control the e-beam and pattern the contact area. The patterns were exposed to e-beam for a set area dosage of 110 µc/cm² and a dwell time of 90 us to form 1 µm² windows. The patterns were developed in a 3:1 Isopropanol: methylisobutylketone solution. After that 30 nm of Cr and 100 nm of Au were deposited to fabricate the MIM diode with 1 µm² contact area.

To achieve tunneling, the dielectric layer needs to be thin, approximately 4 nm, and homogeneous. A thin layer of Nickel Oxide was deposited through a controlled plasma oxidation process using DC magnetron sputtering. For the NiO deposition process, $O_2$ was introduced along with Ar to create a reactive sputtering. NiO was deposited at a very low power of 25 Watts for 10-15 min During the NiO deposition some of the sputtering parameters were varied to study their effect on thickness and roughness of the film. Two sets of experiments were conducted, (1) by varying the argon and oxygen gas flow rate and maintaining a constant deposition time and (2) by keeping the gas flow rate constant and varying the deposition time. Under these conditions, the thickness of the deposited film was measured and the optimal parameters were utilized in the actual fabrication of the MIM diode. The thickness was monitored using a quartz crystal monitor and also evaluated by ellipsometry and Atomic Force Microscopy (AFM). The thickness variation and roughness analysis are described in Section 3.

Since the time required for tunneling to take place is much shorter than the time period of the wave at optical frequencies, the junction capacitance $C_D$ is the limiting factor for determining the cut-off frequency of the MIM diode. In combination with the antenna's resistance, $R_A$, the following expression given by Sanchez (J. G. Simmons, J. Appl. Phys. 34, 2581, 1963), can be used to calculate the cut-off frequency of the diode;

$$f_c = \frac{1}{2\pi R_A C_D} \quad \text{(IV)}$$

Beyond this cut-off frequency, rectification is still possible. However, the signal strength at the output of the MIM will drop approximately by a factor of $1/f^2$. Since the rectifier's efficiency is closely related to the diode's characteristics, the diode's efficiency can also be used to estimate the rectifier's efficiency. The relationship between the voltage rectification efficiency and input voltage of a rectifier with a shunt capacitor $C_L$ at the load resistance $R_L$ is seen in FIG. 8. The third order approximation of measured I-V characteristics of the MIM diode, which shows strong parabolic behavior in the forward region, is presented in FIG. 9.

The asymmetry exhibited by these diodes has been determined by the normal rectification ratio (NRR), defined as the ratio of forward current IF(V) to reverse current IR(V). In both the devices, the asymmetry ratio increases monotonically with the applied voltage and reaches a maximum of 4.5 at V=1 V for detector A and about 6 at V=0.2 V for detector B. This maximum value corresponds to the maximum value of forward current injected across the barrier (C. Tiusan, et al., Appl. Phys. Lett. 79, 4231, 2001). Though the asymmetry value is lesser than the value reported by Tiusan et al. it certainly preserves the asymmetry over a range of applied voltage. This lower value of asymmetry ratio can be attributed towards the lateral size of the detectors and also due to a different material combination. The asymmetry ratio reported by Tiusan et al. (C. Tiusan, et al., Appl. Phys. Lett. 79, 4231, 2001) was obtained over a very small region (<3 nm) with barrier thickness as low as 0.1 nm But when compared with a similar MIM diode (Ni—NiO—Au) reported for IR detection (D. Sater, M. S. Thesis, University of Cincinnati, 1984), the detectors A and B exhibit higher rectification ratio. This is due to the higher work-function difference that is established between Ni and Cr (0.65 eV) than Ni and Au (0.1 eV). Although the lateral size of the detectors changed by 2 orders of magnitude, the current exhibited by the detectors changed by 4 orders of magnitude. This discrepancy is due to the thickness variation of the dielectric layer. As reported by Da Costa (V. Da Costa, et al., J. Magn. Magn. Mater. 258, 90, 2003) disorder effects in MIM junctions are highly unpredictable. Hence even a small thickness variation in the dielectric layer could cause a large fluctuation in its electrical behavior.

Example 1

Energy conversion device 100 comprises antenna 10 or antenna array 10a connected to rectifier 20, forming a rectenna Only a single optical antenna 10 is depicted in FIG. 10, however an array of optical antennas 10a exists. The rectenna comprises an antenna directly engaged to a rectifier 20, or connected to rectifier 20 via transmission lines 30. The rectifier 20 is a metal-insulator-metal diode. Energy conversion device 100 may be connected in parallel, series, or hybrid, such that the currents generated merge, resulting in a useful setup when producing large dimension single energy conversion device 100 is practically prohibitive. The setup allows multiple energy conversion devices to be further integrated into large-scale assemblies where neighbor devices share a common transmission cable 31 to simplify connections. The energy collected by the antennas 10 will be concentrated in the transmission lines 30, whereby the energy is rectified and converted into electricity. The total area of the rectification area, e.g. the transmission line, may be of any size, not limited by the scale of the incident wavelength.

The antenna may be formed from lithography, printing, or grown as a nanorod. Where the antenna is grown, the rectifier 20 may be engaged to the antenna either before the antennas are grown on metal substrate 110 or after they are grown on metal substrate 110. The antenna may be manufactured using top-down electron beam lithography, bottom-up nanostructure synthesis, or other method known in the art. In an embodiment, a bottom-up procedure is used to fabricate high-efficiency energy conversion devices using random arrays of aligned antennas, such as multi-walled carbon nanotubes (MWCNTs). Antennas 10 may be fabricated from a nanorod. In one embodiment, the nanorod comprises aluminum, gold, carbon nanotubes, a dielectric material, heavily doped Si, GaAs, SiGe, Sic, and GaN (p-type or n-type). For multi-layer fabrications, transparent semiconductors are employed, including, but not limited to, ZnO:Al (n-type), $SrCu_2O_2$ (p-type), and $CuAlO_2$. The material of antenna 10 and rectifier 20 sections can be properly chosen to activate plasma resonances, resulting in an enhancement of antenna 10 response. Nano structures of gold and silver have plasmonic frequencies in the visible frequency range that may be tuned by changing antenna 10 geometry. Thus, the electrical field response may be intensified by a factor of several orders of magnitude, both in the case of antenna 10, as well as in rectifier 20. Antenna 10 optionally includes tuning stubs 11, connected near antenna feed 12, seen in FIG. 4. The antenna also may include slot 13.

Antennas 10 are grown using plasma-enhanced chemical vapor deposition (PECVD) method. Alternatively, vertically-aligned antennas 10 may be grown, or lithographically created on a metal substrate 110, that can be etched or dissolved later. The optical antennas 10 are in contact with the rectifier's semiconductor material 21 resulting in a tunnel junction. A catalytic metal, such as, Ni, Fe, or Co, is deposited onto substrate 112 using DC magnetron sputtering. The desired length and diameter of the antennas is achieved by accurate control of the growth parameters. The deposition thickness of the catalytic metal has a direct affect on the average diameter of the aligned antenna growth. Table 3 lists data showing the average diameters of aligned CNTs grown in a PECVD system using different deposition thickness of Ni as the catalytic metal. Aligned carbon antennas are grown using a DC glow discharge plasma in an atmosphere of $NH_3$ and $C_2H_2$. Mixing ratios of about 4:1 or about 2:1 can be used. A growth time of about 1-2 min, yields carbon antennas of about 1000 nm. The morphology of the antennas, including length, diameters, straightness, etc., can be finely tuned by the other growth parameters such as plasma intensity and etching time, temperature, and total growth time. By modifying the growth parameters, and/or the geometry of the bias voltage electrodes, a nonuniform growth can also be achieved. A highly transparent passivation layer is then spin-coated onto antennas 10. Exemplary passivation layers include a PMMA/co-polymer layer, a silicone elastomer layer or another polymeric material layer. The passivation layer is then baked at <200° C.

TABLE 3

A compilation of average diameters of aligned
carbon nanotubes (CNTs) grown in PECVD using
differing deposition thicknesses of Ni as a catalytic metal.

| Ni film thickness (nm) | Average CNT diameter (nm) |
| --- | --- |
| 4 | 30 |
| 10 | 60 |
| 16 | 75 |
| 22 | 100 |
| 28 | 130 |

Antenna array 10*a* may form various geometric morphologies. Exemplary embodiments include a dipole antenna design, a conventional microwave antenna, a bow-tie antenna design (non-linear antenna design), a loop antenna design (such as, an antenna forming a loop, parallel to the ground yielding a non-linear antenna design), and a spiral antenna design (non-linear antenna design), seen in FIGS. 11(*a*)-(*c*). These various configurations allow for the antennas to have various bandwidth response, various directional response patterns with respect to the direction of wave propagation as well as the polarization, and various impedance matching options. When narrow bandwidth antennas 10 are used, stacks of layers of antenna structures 10*b* with different working frequencies may be used to respond collectively to a wide solar spectrum (for example, in a dipole design). Alternatively, the same could be achieved by implementing antenna arrays 10*a* with random length. If in addition to random length a random orientation of antennas 10 is used, response to an unpolarized light will be maximized.

Rectifier 20 is a metal-insulator-metal (MIM) diode capable of rectifying optical frequency alternating current (AC) into direct current (DC) electricity. Antennas 20 are connected to a metal electrode 21, on the MIM rectifier. An asymmetric metal-insulator-metal (MIM) tunnel junction structure forms an ultra-fast diode, but requires very accurate control of the insulating layers thickness at the atomic scale to ensure reproducibility and scalability. The difference of the instantaneous electric field strength on the opposing antennas 10 and rectifier 20 causes electrons to tunnel through the intermediate layer having an asymmetric barrier height at the two junctions, resulting in net current flow.

MIM diodes were fabricated using a two level photolithography mask and one level e-beam lithography to achieve fine dimensions, as discussed above. For each photolithography step Futurrex NR-3000PY negative photoresist was used in conjunction with Quintel Q-2000C Mask Aligner. Briefly, Si substrates were chemically cleaned by a standard RCA procedure and an $SiO_2$ layer thermally grown at 1100° C. for a thickness of ~450 nm. The wafers were subjected to photolithography to define the Au contact pads and the substrate was deposited with a thick layer of Au (100 nm) by thermal evaporation using Denton DV-502, with excess metal and photoresist removed by a lift-off process using acetone. Secondly, Ni and NiO patterns were defined by photolithography. Then, 100 nm of Ni was deposited using DC magnetron sputtering. After the Ni deposition, the surface was oxidized by passing $O_2$ and sputtering Ni at very low power (25 W) to form a thin layer. Finally, the top electrode was defined using e-beam lithography. A 150 nm thick PMMA (MicroChem 950-K 3% Anisole) was spun on the substrate and baked at 180° C. for 2 hrs. The devices were then patterned by a modified JEOL JSM-840 scanning electron microscope operating at an accelerating voltage of 30 kV with an exposure current of 30 pA. Nabity's Nanometer Pattern Generation System (NPGS) was used to control the ebeam and pattern the contact area. The patterns were developed in a 3:1 Isopropanol:methylisobutylketone (MIBK) solution for 70 s. The samples were then deposited with a 30 nm of Cr followed by 100 nm Au deposition, seen in FIG. 12.

FIG. 13 shows an embodiment of energy conversion device 100, where full spectrum unpolarized sunlight may be efficiently converted to DC electricity. Energy conversion device 100 is composed of multiple stacks or layers, wherein each stack consists of antenna array 10a. The stacks are oriented such that the antenna array in each stack aligns with a different orthogonal 3-dimensional axis. The parallel antenna stacks (in x-y plane) may be made as wide as possible but must be sufficiently thin to allow good transmission. Fabrication of substrate strips at this scale may be achieved using contemporary photolithography or grown. The antennas oriented perpendicular to the exposed surface (in z direction) have no express limitations in dimensions. However, the number of devices in a stack practically limits the z-direction dimensions. The fact that the solar radiation has lower power in longer wavelengths suggests a lower demand for the quantity of longer antennas, ensuring no significant change in level thickness along the z direction. Energy collector 110 collects waste energy and converts the energy to low grade thermal energy, which is converted to electric power by energy conversion device 100. Energy conversion device 100 is optionally supported by a reflecting mirror 120 facing up to permit secondary absorption by energy collector 110.

Energy conversion device 100 is used in conjunction with a solar energy absorber, which functions as energy collector 110. A selective black absorbers that emit infrared radiation within a specific wavelength range, i.e. in a defined frequency band, leads to more efficient collection of infrared frequencies by the rectenna.

To utilize the entire solar spectrum, the solar energy absorber absorbs the solar electromagnetic radiation and converts it to thermal energy heating the black surface of the absorber. Alternatively, solar collectors, photovoltaic, solar concentrator receiver, waste thermal energy receivers may be used to absorb radiation. The large area rectenna is placed underneath the collecting surface, in front of the emitting surface, or both for the direct conversion of thermal (infrared) energy to electricity.

Example 2

A rectenna was placed behind (underneath) a photovoltaic (PV) module. Assuming the conversion efficiency of the PV module is 10-20%, then approximately 80-90% of the solar energy is converted to heat. If a PV panel operates under one sun conditions at 60 degrees centigrade, the panel back surface radiates about 700 W/m². Assuming the rectenna conversion efficiency is 40%, an additional 280 W/m² is produced. The combined PV/rectenna output is now about 380 to 480 W/m² giving a module efficiency of 38-48%.

Example 3

Typical solar hot water heaters operate at 60 to 80 deg. centigrade temperatures. Placement of the rectenna, with an assumed 40% efficiency, underneath the collector produces an electrical output of 280 to 340 W/m². This also permits use of the device during night or cloudy conditions, as the thermal energy stored, i.e. the hot water, allows more continuous power generation, as seen in Equation (V);

$$\tau(E) = \exp\left(-2 \int_{x_1}^{x_2} \{2m * [qV(x) - E]\}^{1/2} dx/\hbar\right), \quad (V)$$

In the preceding specification, all documents, acts, or information disclosed does not constitute an admission that the document, act, or information of any combination thereof was publicly available, known to the public, part of the general knowledge in the art, or was known to be relevant to solve any problem at the time of priority.

The disclosures of all publications cited above are expressly incorporated herein by reference, each in its entirety, to the same extent as if each were incorporated by reference individually.

While there has been described and illustrated specific embodiments of a rectenna, it will be apparent to those skilled in the art that variations and modifications are possible without deviating from the broad spirit and principle of the present invention. It is also to be understood that the following claims are intended to cover all of the generic and specific features of the invention herein described, and all statements of the scope of the invention which, as a matter of language, might be said to fall therebetween.

What is claimed is:

1. An energy collecting device, comprising:
    at least one rectenna, further comprising:
        at least one antenna;
        a metal-insulator-metal rectifier in electrical connection with the at least one antenna; and
    an energy absorbing material, in proximity to the rectenna, wherein the energy absorbing material absorbs electromagnetic energy and radiates thermal energy.

2. The energy collecting device of claim 1, wherein the at least one rectenna is connected to other rectennas in parallel, series, or in a hybrid connection.

3. The energy collecting device of claim 1, wherein the at least one antenna is made of at least one material selected from the group consisting of aluminum, gold, carbon, a dielectric material, doped Si, GaAs, SiGe, GaN, and Ag.

4. The energy collecting device of claim 1, wherein the at least one antenna has a morphology selected from the group consisting of dipole antenna design, a conventional microwave antenna, a bow-tie antenna design, a loop antenna, and a spiral antenna design.

5. The energy collecting device of claim 1, wherein the at least one antenna further comprises at least one tuning stub on the at least one antenna's feed.

6. The energy collecting device of claim 1, wherein the at least one antenna is a plurality of stacked antennas.

7. The energy collecting device of claim 6, wherein the plurality of stacked antennas is disposed such that at least one antenna array aligns with each orthogonal 3-dimensional axis.

8. The energy collection device of claim 1, wherein the metal-insulator-metal rectifier is comprised of at least one compound selected from the group consisting of Ni, Au, Ag, Pt, NiO, Al, Al$_2$O$_3$, Nb, NbO$_x$, Cr, Ag, and CrO.

9. The energy collection device of claim 1, wherein the metal-insulator-metal rectifier is comprised of Ni and NiO, and wherein the metal-insulator-metal rectifier has counter electrodes made of at least one compound selected from the group consisting of Ni, Au, Ag, Pt, and Ni—NiO—Cr/Au.

10. The energy collection device of claim 9, wherein the metal-insulator-metal rectifier is comprised of a Ni electrode, a NiO layer, a Cr layer and an Au electrode.

11. The energy collecting device of claim 1, wherein the energy absorbing material is at least one material selected from the group consisting of a black surface, a solar collector, a photovoltaic, a solar hot water heater, a solar concentrator receiver, and a waste thermal energy device.

12. The energy collecting device of claim 1, further comprising a transmission line in electrical communication with the antenna and the rectifier.

13. The energy collecting device of claim 1, further comprising an energy reflector disposed below the energy absorbing material and oriented to reflect electromagnetic radiation to the energy absorbing material.

14. A method for collecting unused electromagnetic energy, comprising:
  providing an energy collecting device, further comprising:
    at least one antenna;
    a metal-insulator-metal rectifier in electrical connection with the at least one antenna; and
    an energy absorbing material, in proximity to the antenna;
  absorbing unused electromagnetic radiation in the energy absorbing material;
  converting the unused electromagnetic radiation into thermal energy;
  collecting the thermal energy; and
  converting the collected thermal energy to electricity.

15. The method of claim 14, wherein the unused electromagnetic energy is selected from the group consisting of thermal energy, ultraviolet energy, visible energy, infrared energy.

16. The method of claim 15, wherein the used energy originates from the sun.

17. The method of claim 15, wherein the electricity is DC electricity.

18. The method of claim 15, wherein the at least one antenna is made of at least one material selected from the group consisting of aluminum, gold, carbon, a dielectric material, doped Si, GaAs, SiGe, GaN, and Ag.

19. The method of claim 15, wherein the metal-insulator-metal rectifier is comprised of at least one compound selected from the group consisting of Ni, Au, Ag, Pt, NiO, Al, $Al_2O_3$, Nb, $NbO_x$, Cr, Ag, and CrO.

20. The method of claim 15, wherein the energy absorbing material is at least one material selected from the group consisting of a black surface, a solar collector, a photovoltaic, a solar hot water heater, a solar concentrator receiver, and a waste thermal energy device.

21. The method of claim 15, further comprising reflecting unabsorbed electromagnetic energy to the energy absorbing material.

* * * * *